United States Patent
Partsch et al.

(10) Patent No.: US 7,345,931 B2
(45) Date of Patent: Mar. 18, 2008

(54) MAINTAINING INTERNAL VOLTAGES OF AN INTEGRATED CIRCUIT IN RESPONSE TO A CLOCKED STANDBY MODE

(75) Inventors: Torsten Partsch, Raleigh, NC (US); George Alexander, Durham, NC (US); Ben Heilmann, Raleigh, NC (US); David Herbert, Raleigh, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/194,302

(22) Filed: Aug. 1, 2005

(65) Prior Publication Data

US 2007/0025163 A1    Feb. 1, 2007

(51) Int. Cl.
*G11C 5/14* (2006.01)
(52) U.S. Cl. ............ 365/189.09; 365/227; 323/364
(58) Field of Classification Search ........... 365/189.09, 365/227, 229; 323/364
See application file for complete search history.

(56) References Cited

U.S. PATENT DOCUMENTS

| | | | |
|---|---|---|---|
| 6,344,992 B1 * | 2/2002 | Nakamura | 365/154 |
| 6,359,809 B1 * | 3/2002 | Tedrow et al. | 365/185.29 |
| 6,754,111 B2 * | 6/2004 | Pekny | 365/189.09 |
| 7,046,576 B2 * | 5/2006 | Kim et al. | 365/230.05 |
| 2004/0027866 A1 * | 2/2004 | Pekny | 365/189.09 |
| 2004/0245979 A1 * | 12/2004 | Ikoma et al. | 323/364 |

* cited by examiner

*Primary Examiner*—Amir Zarabian
*Assistant Examiner*—Anthan T Tran
(74) *Attorney, Agent, or Firm*—Patterson & Sheridan, L.L.P.

(57) ABSTRACT

A method and circuit for controlling an output reference voltage generated by a reference voltage generator disposed on a memory device are provided. A signal for enabling a clocked standby mode of the memory device is received. If the signal indicates that the memory device is in the clocked standby mode, a first reference voltage is generated as the output reference voltage of the reference voltage generator using a first voltage. If the signal indicates that the memory device is not in the clocked standby mode, a second reference voltage is generated as the output reference voltage of the reference voltage generator using a second voltage.

9 Claims, 9 Drawing Sheets

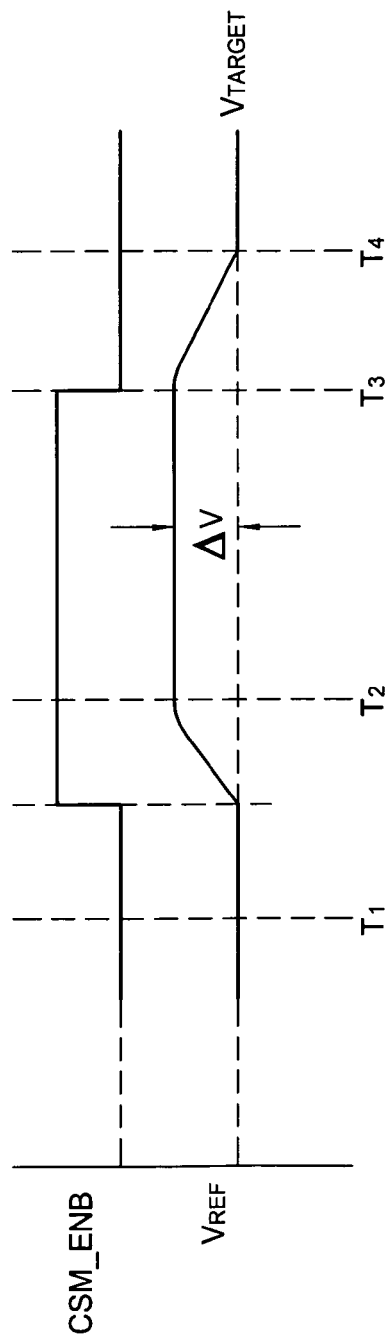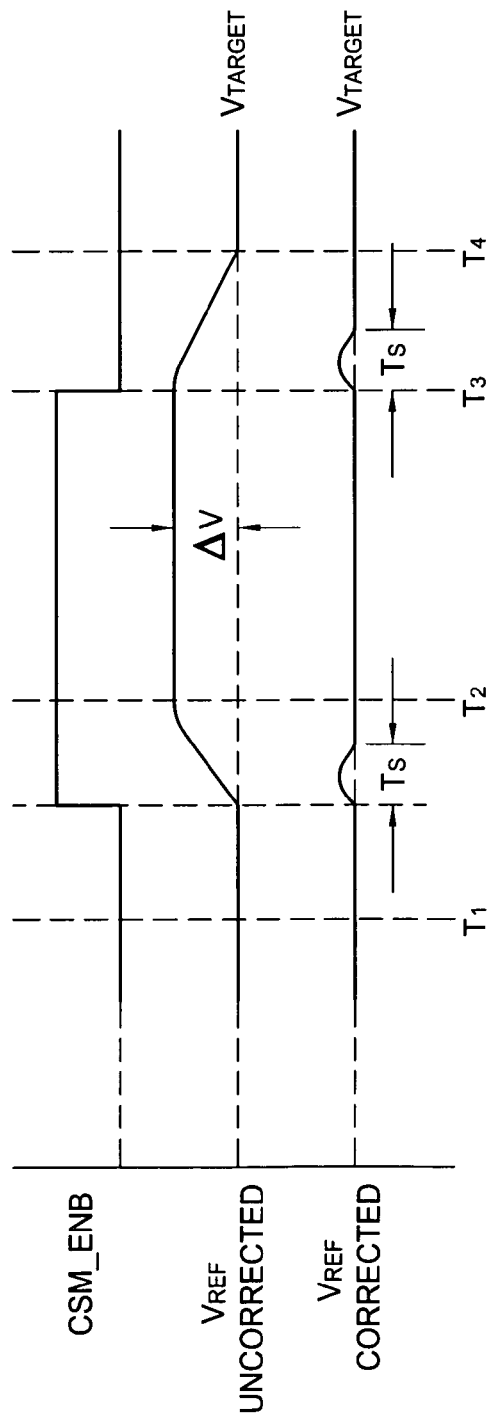

MAINTAINING INTERNAL VOLTAGES OF AN INTEGRATED CIRCUIT IN RESPONSE TO A CLOCKED STANDBY MODE

BACKGROUND OF THE INVENTION

1. Field of the Invention

Embodiments of the present invention generally relate to an improved implementation of clocked standby mode in a digital circuit.

2. Description of the Related Art

Integrated circuit (IC) devices often operate using various internally generated voltages in an effort to reduce sensitivity to fluctuating external voltage supplies. Each internally generated voltage may also be used to perform different functions required by the IC. A circuit, referred to as a voltage generation circuit, may be used to generate each necessary internal voltage. A typical memory device, such as a dynamic random access memory (DRAM) device may include many such voltage generation circuits, configured to generate a wide range of voltages, which may include voltages that are positive with respect to a ground reference (e.g., a boosted wordline voltage or $V_{PP}$) and voltages that are negative with respect to a ground reference (e.g., a back-bias voltage, $V_{BB}$, or negative wordline voltage, $V_{NWL}$).

Each voltage generation circuit on a given device may consume power while generating a voltage. In order to conserve the power consumed by the IC device, the voltage generation circuit may be placed in a mode (referred to as a standby mode) where the circuit is selectively enabled and disabled. In the standby mode, the voltage generation circuit may be enabled while the required voltage is being used by the IC device. For instance, if the IC device is a memory device, the voltage generation circuit may be enabled just before the memory device is about to use the output of the voltage generation circuit to perform an access (e.g., a read, write, or refresh). While enabled to generate the required voltage, the voltage generation circuit may consume power. When the memory device is not being accessed, the voltage is not required and the voltage generation circuit may be disabled, thus conserving power. Because each access to the memory device may be timed according to a clock (e.g., refresh operations may be triggered by a self-refresh timer), a clock signal may be used to selectively enable and disable the voltage generation circuit just before each access. Accordingly, the standby mode may be referred to as a clocked standby mode (CSM).

FIG. 1 is a block diagram depicting an exemplary memory device 100 which utilizes a clocked standby mode. The memory device 100 may have control circuits 102 used to access one or more memory arrays 104 of the memory device 100. The control circuits 102 may have several internal circuits which may be used to configure and control the memory device. For instance, the control circuits 102 may have a temperature sensor 108 which may be used to measure the temperature of the memory device 100. Based on the measured temperature, an operating characteristic of the memory device 100 (such as a self-refresh period) may be adjusted.

The memory device 100 may contain a reference voltage generator 110 and voltage generation circuit(s) 112. The reference voltage generator 110 may generate an output reference voltage $V_{REF}$ which may be used by the voltage generation circuits 112 to generate output voltages $V_{OUT}(s)$, $V_1, V_2, \ldots V_X$. The output voltages $V_1, V_2, \ldots V_X$ and the reference voltage $V_{REF}$ may be supplied to the control circuits 102 and memory arrays 104 of the memory device 100. The reference voltage may be used by the control circuit 102 to access (e.g., read, write or refresh) memory arrays 104. The reference voltage generator 110 and the voltage generation circuit(s) 112 may be selectively enabled and disabled by clocked standby mode controls 114. In some cases, the clocked standby mode controls 114 may be enabled or disabled by the control circuits 102. In other cases, the clocked standby mode controls 114 may be permanently enabled such that an enabling signal is not used, or the clocked standby mode controls 114 may be permanently enabled by blowing a fuse such as a laser fuse or electronically programmable fuse (e-fuse) of the memory device 100.

FIG. 2 is a block diagram depicting exemplary clocked standby mode controls 114 which are used to selectively enable one or more voltage generation circuits 112 and a reference voltage generator 110. The input to the clocked standby mode controls 114 may be a signal to enable the clocked standby mode (referred to as CSM_EN). When CSM_EN is a high logic value, the clocked standby mode may be enabled and a clocked standby mode clock signal (CSM_CLK) may be generated by the clocked standby mode controls 114. In some cases, the clocked standby mode controls 114 may use another clock signal, referred to as a base clock signal (Base_CLK) to generate a clocked standby mode clock signal. The clocked standby mode control signal CSM_CLK may be used to selectively enable and disable the voltage generation circuits 112 and the reference voltage generator 110. When CSM_EN is a certain value (e.g., a low logic value), the clocked standby mode may be disabled, meaning that the voltage generation circuits 112 and the reference voltage generator 110 may constantly generate output voltages and reference voltages. When the clocked standby mode is disabled, the CSM_CLK signal may be set to a constant value (e.g., a low logic value) in order to constantly enable the voltage generation circuits 112 and reference voltage generator 110.

In some cases, enabling and disabling the reference voltage generator 110 and the voltage generation circuits 112 may cause fluctuations in the output reference voltage $V_{REF}$ of the reference voltage generator 110 and output voltages $V_1, V_2, \ldots V_X$ of the voltage generation circuits 112. For instance, in some cases, enabling and disabling the reference voltage generator 110 may cause a charge build up in the output reference voltage $V_{REF}$. Fluctuations in $V_{REF}$ (positive or negative) may in turn cause changes in the output voltages $V_1, V_2, \ldots V_X$ of the voltage generation circuits 112. In other cases, even if $V_{REF}$ remains stable, enabling and disabling the voltage generation circuits may cause fluctuations directly in the output voltages $V_1, V_2, \ldots V_X$ of the voltage generation circuits 112, regardless of any changes in $V_{REF}$. Changes in $V_{REF}$ and the output voltages $V_1, V_2, \ldots V_X$ of the voltage generation circuits 112 of the memory device 100 may cause the memory device 100 to malfunction. For instance, if one or more of the voltages $V_{REF}$ or $V_1, V_2, \ldots V_X$ are used by the control circuits 102 to refresh memory arrays 104 of the memory device 100, changes in the voltages may cause an insufficient refresh of the memory arrays 104 and result in memory loss.

Accordingly, what is needed are improved methods and apparatuses for regulating voltages affected by a clocked standby mode.

SUMMARY OF THE INVENTION

Embodiments of the invention generally provide a method and circuit for controlling an output reference voltage generated by a reference voltage generator disposed on a memory device are provided. In one embodiment, a signal for enabling a clocked standby mode of the memory device is received. If the signal indicates that the memory device is in the clocked standby mode, a first reference voltage is generated as the output reference voltage of the reference voltage generator using a first voltage. If the signal indicates that the memory device is not in the clocked standby mode, a second reference voltage is generated as the output reference voltage of the reference voltage generator using a second voltage.

In another embodiment of the invention, a control signal for enabling a clocked standby mode of a device containing a voltage generator is received. If the control signal indicates that the clocked standby mode is disabled, an output voltage generated by the voltage generator is generated using an input voltage supplied to the voltage generator. If the control signal indicates that the clocked standby mode is enabled, the input voltage supplied to the voltage generator is modified and the modified voltage is used to generate the output voltage of the voltage generator.

Another embodiment of the invention provides a memory device having a means for generating a reference voltage and a means for controlling a clocked standby mode. The means for generating the reference voltage is configured to receive a control signal for enabling the clocked standby mode of the memory device. The means for generating the reference voltage generates a first reference voltage as the output voltage of the voltage generator using a first input voltage if the control signal indicates that the clocked standby mode of the memory device is enabled. The means for generating the reference voltage generates a second reference voltage as the output of the voltage generator using a second input voltage if the control signal indicates that the clocked standby mode of the memory device is disabled. The means for controlling the clocked standby mode is configured to selectively enable and disable the means for generating the reference voltage when the clocked standby mode of the memory device is enabled.

In yet another embodiment of the invention a circuit having a power supply, a reference voltage output line, a first circuit, and at least one resistance is provided. The first circuit is configured to generate a reference voltage on the reference voltage output line using a supply voltage provided by the power supply. The at least one resistance is interposed between the power supply and the reference voltage output line, wherein the resistance is enabled and disabled by a signal for enabling and disabling a clocked standby mode, wherein enabling and disabling the at least one resistor increases or decreases the reference voltage on the reference voltage output line.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 4 is a timing diagram which depicts the effect of the clocked standby mode on the output voltage $V_{OUT}$ of a voltage generation circuit.

FIG. 7 is a timing diagram which depicts the effect of inserting compensating, selectively enabled resistances into a reference voltage generator according to one embodiment of the invention.

DETAILED DESCRIPTION OF THE PREFERRED EMBODIMENT

Embodiments of the invention generally provide a method and circuit for controlling an output reference voltage generated by a reference voltage generator disposed on a memory device are provided. In one embodiment, a signal for enabling a clocked standby mode of the memory device is received. If the signal indicates that the memory device is in the clocked standby mode, a first reference voltage is generated as the output reference voltage of the reference voltage generator using a first voltage. If the signal indicates that the memory device is not in the clocked standby mode, a second reference voltage is generated as the output reference voltage of the reference voltage generator using a second voltage.

The circuits described herein may be used to advantage in any number of devices that utilize internally generated voltages and reference voltages. However, to facilitate understanding, the following description will refer to memory devices, such as dynamic random access memory (DRAM) devices, as specific, but not limiting examples of devices in which the circuits described herein may be utilized. Further, while the following description may refer certain control signals as being asserted to high logic signals or lowered to low logic signals, those skilled in the art will recognize that such signal levels are merely exemplary and that any circuitry described herein may be configured to use any number of signals of any polarity and/or voltage level. While some signals are referred to as originating from a given control circuit or device, it should be recognized that any described control signal may originate from any given circuit or device. Also, any signal names described herein are exemplary, and in general embodiments of the invention may be implemented with any signal(s) bearing any name(s), and/or from any signal(s) derived from one or more such signals.

Similarly, described implementations of certain circuits such as clocked standby mode controls, control circuits, voltage generators, reference voltage generators, voltage regulators, and so on are merely exemplary. In some cases, simplified implementations of such circuits are presented in order to better explain aspects of embodiments of the present invention. However, those skilled in the art will recognize that embodiments of the present invention may be adapted for use with any implementation or configuration of such circuits, including complicated and/or commercial implementations of such circuits.

Generating Voltages for the Memory Device

Figure 3:
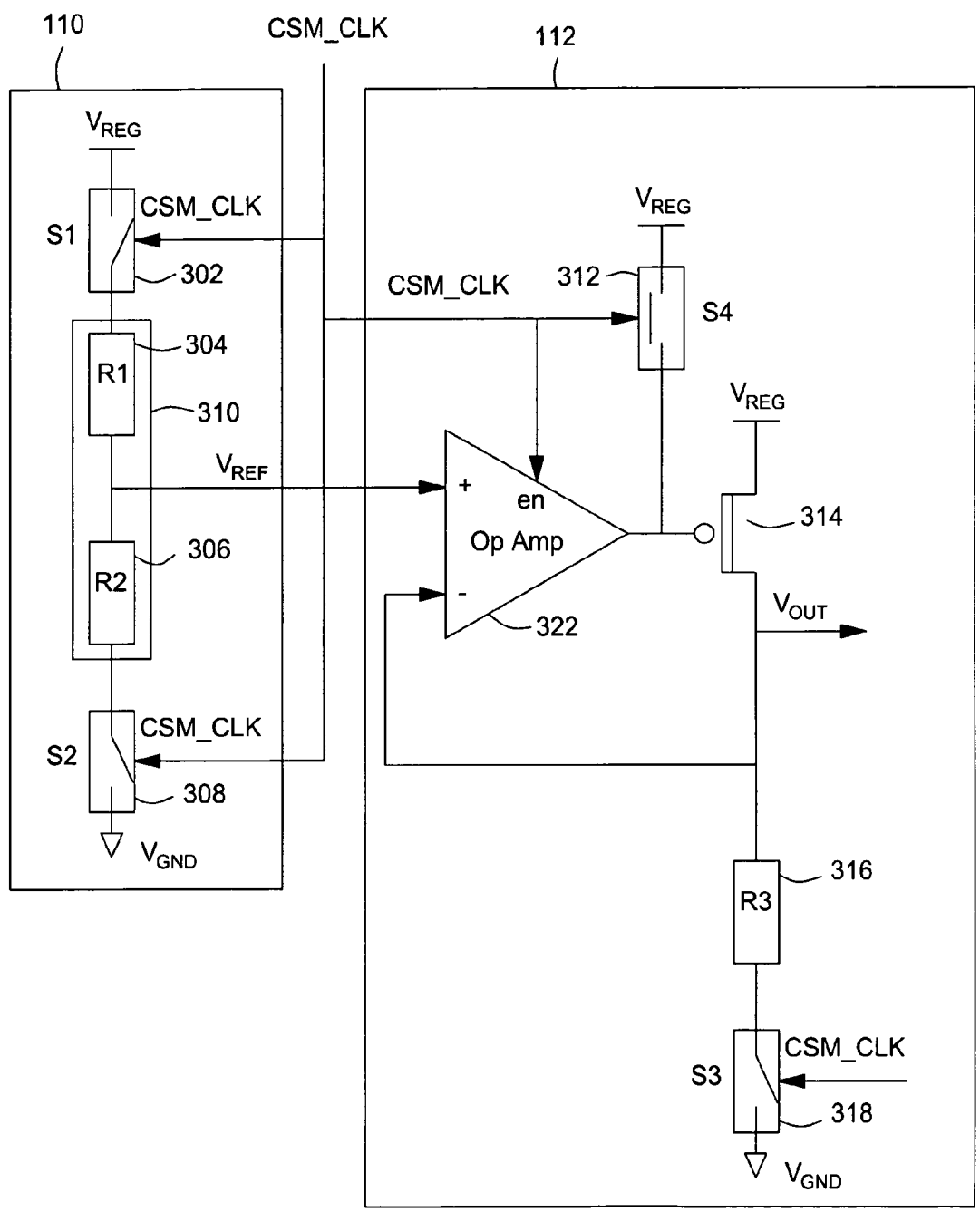
FIG. 3 is a circuit diagram depicting an exemplary voltage generation circuit.

So that embodiments of the invention may be better understood, exemplary methods and circuits for generating a reference voltage and an output voltage of a voltage generation circuit 112 are now described. FIG. 3 is a circuit diagram depicting an exemplary reference voltage generator circuit 110 and an exemplary voltage generation circuit 112 which are selectively enabled and disabled by a clocked standby mode signal (CSM_CLK).

When the reference voltage generator 110 and voltage generation circuit 112 are enabled (e.g., when the CSM_CLK signal is a low logic value), switches S1 302, S2 308, and S3 318 may be closed while switch S4 312 may be open, allowing current to flow through the voltage generation circuit 112 and generating output voltage $V_{OUT}$ from reference voltage $V_{REF}$ as described below.

In one embodiment of the invention, the reference voltage $V_{REF}$ may be generated by a voltage divider which has two resistors R1 304 and R2 306 connected through switches to a high voltage ($V_{REG}$) and a low voltage ($V_{GND}$). The voltage divider, or any other group of resistors, transistors, or other IC elements may also be referred to as a resistance network 310. When the CSM_CLK signal enables the voltage generator 112, the switches S1 302 and S2 308 are closed and the reference voltage is generated by current flowing through resistors R1 304 and R2 306. The generated reference voltage may be expressed by the equation:

$$V_{REF}=(V_{REG}-V_{GND})*R2/(R1+R2).$$

By varying the values for R1 304 and R2 306, a desired reference voltage $V_{REF}$ may be generated.

The reference voltage output by the resistance network 310 may be input into a voltage generation circuit 112 (also referred to as a voltage regulator). A voltage regulator is an electronic circuit which maintains an output voltage ($V_{OUT}$) at a constant level with respect to an input voltage ($V_{REF}$). When the voltage generation circuit 112 is enabled, an op-amp 322 may be used to compare $V_{OUT}$ to $V_{REF}$. The output of the op-amp 322 may be the input to a PMOS transistor 314 which controls the voltage $V_{OUT}$ using the power supply voltage $V_{REG}$. When the PMOS transistor 314 is on (e.g., when a low voltage is applied by the op-amp 322), current may flow through the PMOS transistor 314, causing $V_{OUT}$ to increase. When the PMOS transistor 314 is off (e.g., when a high voltage is applied by the op-amp 322), no current may flow through the PMOS transistor 314, causing $V_{OUT}$ to decrease if $V_{OUT}$ is connected to a load. Small increases or decreases in the output voltage of the op-amp 322 may thus cause corresponding small decreases or increases in $V_{OUT}$.

When the regulator circuit 112 is enabled, if $V_{OUT}$ is slightly less than $V_{REF}$ (e.g., due to high power consumption by a circuit which uses $V_{OUT}$), the op-amp 322 may decrease the output voltage which is applied to the PMOS transistor 314. When the output voltage to the PMOS transistor 314 is decreased, the current provided by the PMOS transistor 314 to $V_{OUT}$ may increase slightly, causing $V_{OUT}$ to increase to a level which is closer to $V_{REF}$. Similarly, if $V_{OUT}$ is slightly greater than $V_{REF}$ (e.g., due to low power consumption by a circuit which uses $V_{OUT}$), the op-amp 322 may increase the output voltage which is applied to PMOS transistor 314. When the output voltage to the PMOS transistor 314 is increased, the current provided by the PMOS transistor 314 to $V_{OUT}$ may decrease slightly, causing $V_{OUT}$ to decrease to a level which is closer to $V_{REF}$. Thus, by increasing or decreasing the power supplied by $V_{REG}$ to $V_{OUT}$, the voltage regulator may maintain $V_{OUT}$ at a constant level with respect to $V_{REF}$. The ratio of resistor R3 316 to resistors R1 and R2 may be used to determine the voltage level of $V_{OUT}$ with respect to $V_{REF}$.

If CSM_CLK changes from a low logic value to a high logic value, the voltage generator 112 and the reference voltage generator 110 may be disabled. When the voltage generator is disabled, switches S1 302, S2 308, and S3 318 may be open while switch S4 312 may be closed. When switches S1 302, S2 308, and S3 318 are open, the voltage generation circuit 112 and the reference voltage generator 110 may consume less power. When the voltage generation circuit 112 is disabled, $V_{OUT}$ may be electronically isolated from other voltages in the memory device 100 by switches S3 318 and S4 312. When an output voltage is isolated from other voltages in a circuit, the output voltage is referred to as a floating output voltage. Capacitance on the output voltage line tends to hold the output voltage at a constant level (e.g., the output voltage just before the voltage generation circuit 112 was disabled). However, in some cases the floating output voltage may not remain at a constant level. For instance, leakage currents in the memory device 100 may drag the floating output voltage down. This "droop" effect is described in greater detail below with respect to FIG. 8.

Fluctuations in $V_{REF}$ Due to the Clocked Standby Mode

As previously described, enabling and disabling the reference voltage generator 110 may cause fluctuations in the output voltage $V_{REF}$ of the reference voltage generator 110. For example, enabling and disabling the reference voltage generator 110 may lead to a buildup of charge in the reference voltage generator 110 and cause a voltage shift (also referred to as a DC shift) in the reference voltage $V_{REF}$ when the clocked standby mode is enabled. FIG. 4 is an exemplary timing diagram depicting the effect of the signal which enables and disables clocked standby mode (CSM_EN) on the output voltage $V_{REF}$ of the reference voltage generator 110. At some time T1 the signal CSM_EN may be a low logic value indicating that the clocked standby mode is disabled. Thus, at time T1, there may be no offset in the reference voltage $V_{REF}$.

At some time later, T2, the signal CSM_EN may be raised to a high logic level. When CSM_EN is raised to a high logic level, the clocked standby mode may be enabled, and the reference voltage generator 110 may be selectively enabled and disabled using the clocked standby mode clock signal (CSM_CLK). As depicted, enabling the clocked standby mode may cause a voltage shift ΔV in the output voltage $V_{REF}$ of the reference voltage generator. Later, at time T3, the signal CSM_EN may be lowered to a low logic level, disabling the clocked standby mode. Because of the latency inherent in switching the reference voltage generator 110 from a disabled state to an enabled state (e.g., due to capacitance and inductance in the circuit), it may take some time, for example, until time T4, for the reference voltage $V_{REF}$ to return to a normal level. Thus, at time T4, the voltage shift ΔV may no longer be present in the output voltage $V_{REF}$ of the reference voltage generator 110.

While FIG. 4 depicts the offset ΔV due to clocked standby mode in $V_{REF}$ as being positive, in other cases the change, ΔV, may be a negative offset in $V_{REF}$. Regardless of the direction of the offset ΔV, the change ΔV in $V_{REF}$ may cause changes in the output voltage $V_{OUT}$ of the voltage generation circuit 112 and may adversely affect other circuits.

Figure 1:
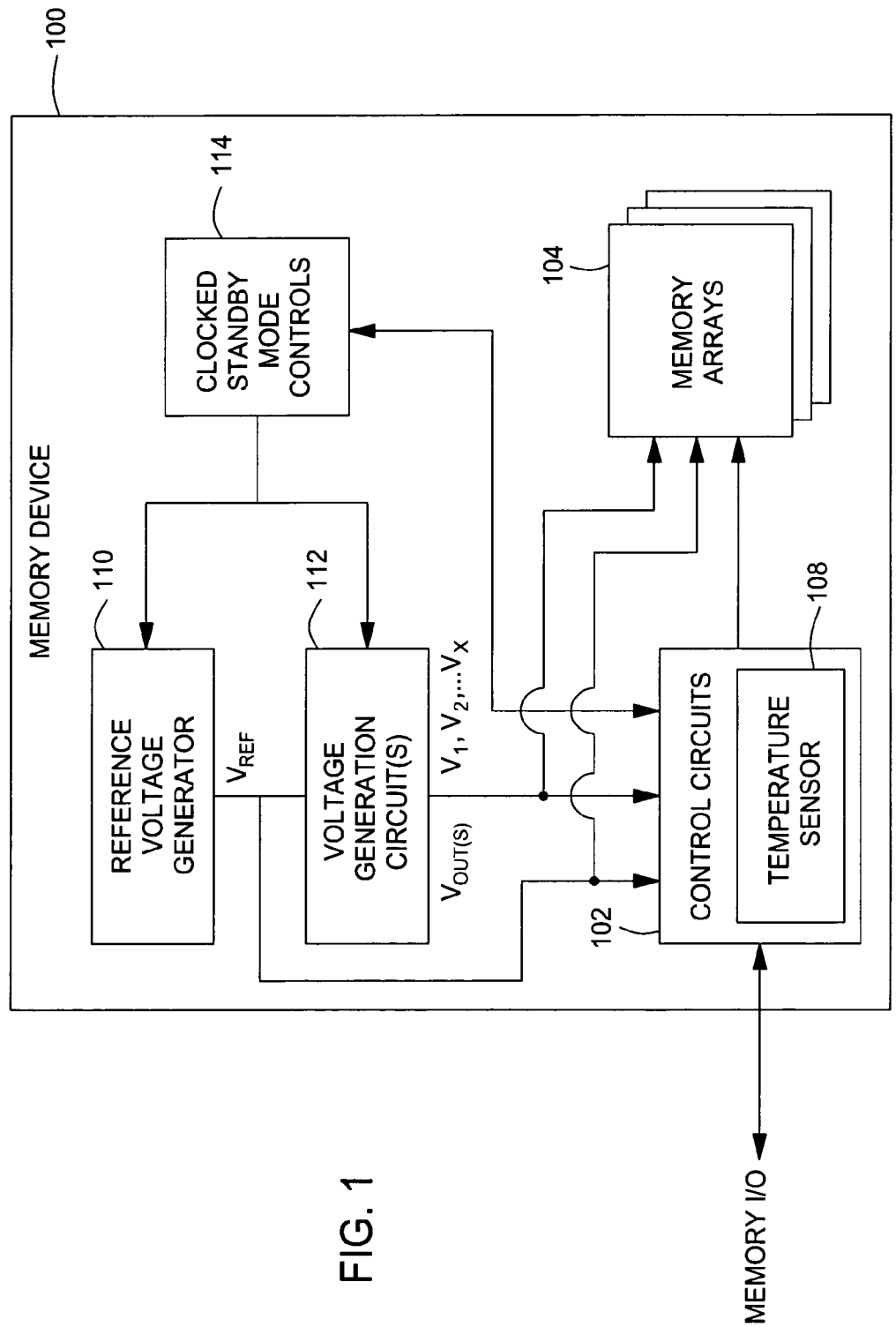
FIG. 1 is a block diagram depicting an exemplary memory device which utilizes a clocked standby mode.

Referring back to FIG. 1, the control circuits 102, which use the reference voltage $V_{REF}$ and/or the output voltage $V_{OUT}$ of the voltage generation circuit 112 may malfunction if the reference voltage and/or output voltages change. As an example, the temperature sensor 108 in the control circuits 102 may use the reference voltage $V_{REF}$ to determine if the temperature of the chip is within a certain range. Based on the measured temperature, the control circuits 102 may set certain control signals used to control the memory device 100. The temperature sensor 108 may be very sensitive to changes in the reference voltage $V_{REF}$. If the temperature sensor does not measure the correct temperature due to a shift ΔV in the reference voltage $V_{REF}$, the control circuits 102 may set the control signals improperly, possibly causing functional failures in the memory device 100 or causing the memory device 100 to not meet requested device specifications.

Figure 5:
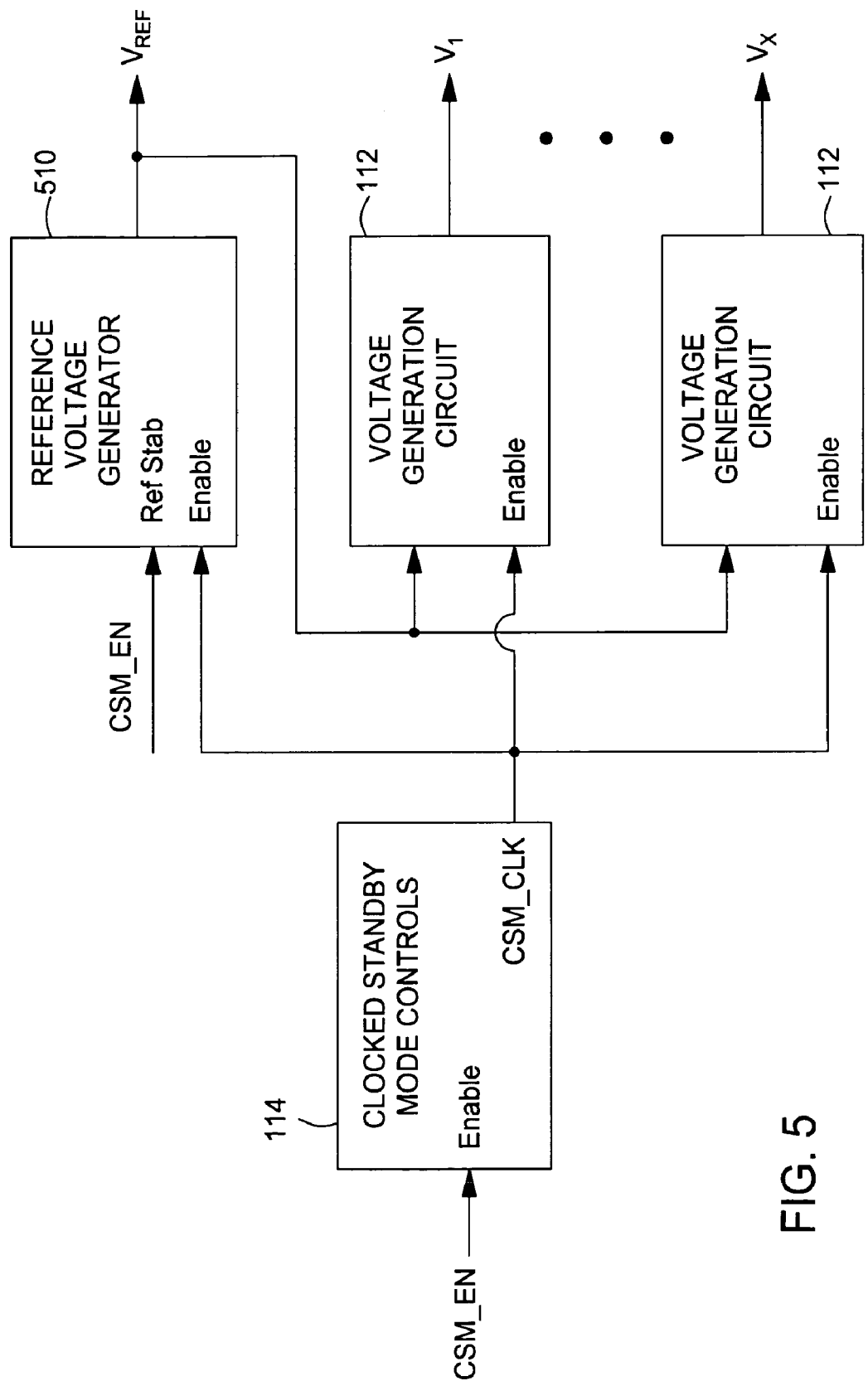
FIG. 5 is a block diagram which depicts a modified reference voltage generator which uses a signal for enabling and disabling the clocked standby mode (CSM_EN) to compensate for a voltage shift in a reference voltage according to one embodiment of the invention.

In one embodiment of the invention, the reference voltage generator circuit 110 may be modified to compensate for the voltage shift ΔV which appears in $V_{REF}$ when the clocked standby mode is enabled. FIG. 5 depicts a modified reference voltage generator 510 which uses the signal for enabling and disabling the clocked standby mode (CSM_EN) to compensate for a voltage shift in a reference voltage according to one embodiment of the invention.

Figure 2:
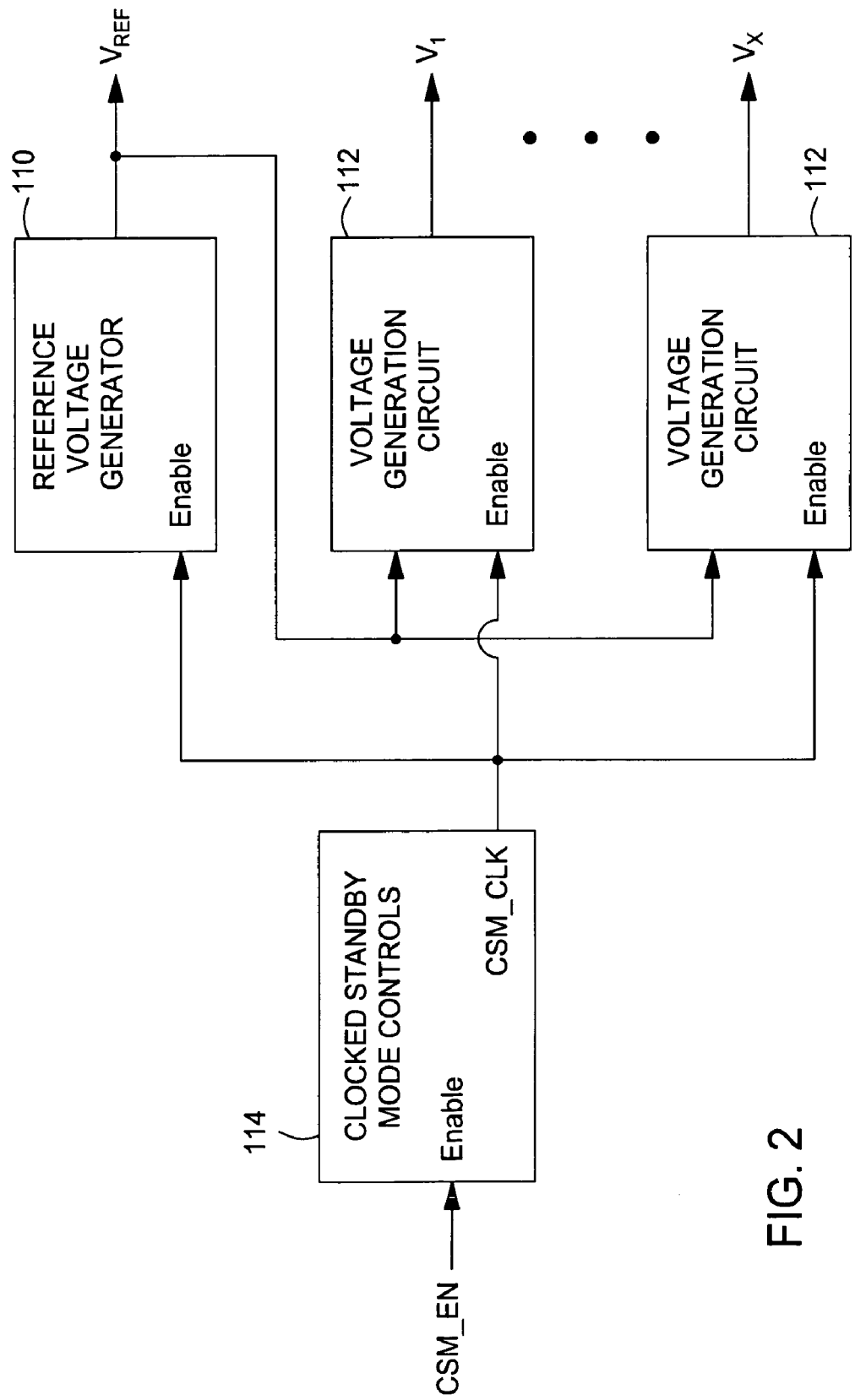
FIG. 2 is a block diagram depicting exemplary clocked standby mode controls which are used to selectively enable one or more voltage generation circuits.
Figure 6:
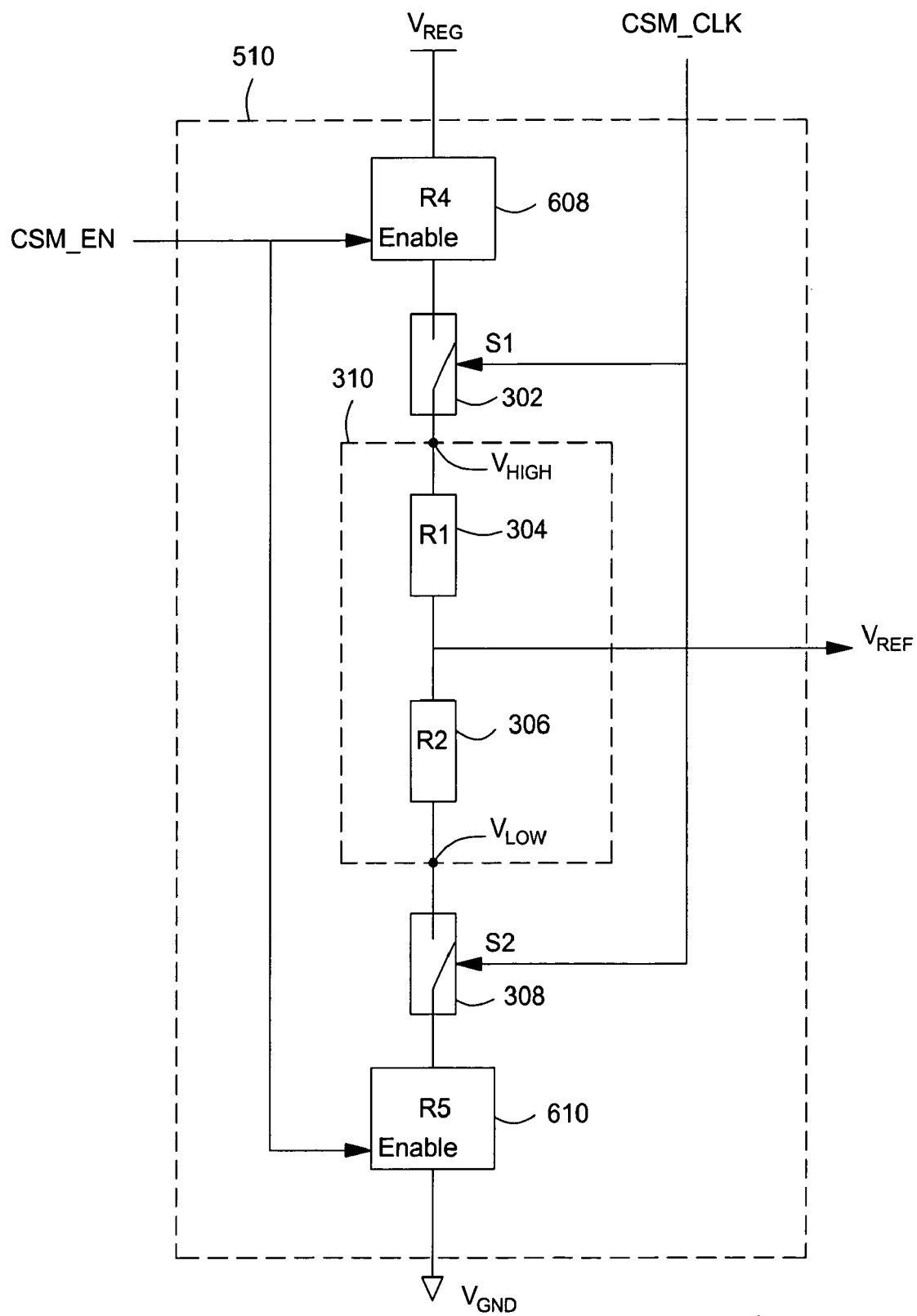
FIG. 6 is a circuit diagram which depicts a modified reference voltage generator according to one embodiment of the invention.

FIG. 6 is a block diagram depicting a modified reference voltage generator 510 according to one embodiment of the invention. As depicted in FIG. 6, the reference voltage generator 110 depicted in FIGS. 1-3 may be modified by inserting an upper resistance R4 608 and a lower resistance R5 610 into the reference voltage generator 510. The upper resistance 608 may be inserted into the voltage generator 510 between the high power supply voltage ($V_{REG}$) and the resistance network 310 used to generate the reference voltage $V_{REF}$. By inserting the upper resistance 608, the voltage input into the resistance network 310 is reduced from $V_{REG}$ to $V_{HIGH}$. Similarly, the lower resistance 610 may be inserted into the reference voltage generator 510 between the low power supply voltage ($V_{GND}$) and the resistance network used to generate the voltage $V_{REF}$. By inserting the lower resistance 610, the voltage input into the resistance network 310 is increased from $V_{GND}$ to $V_{LOW}$.

According to one embodiment of the invention, each of the inserted resistances 608, 610 may be selectively enabled and disabled using the clocked standby mode control signal, CSM_EN, the same signal used to enable and disable the clocked standby mode. By enabling and disabling the upper and lower resistance appropriately, the reference voltage generator 510 may compensate for the voltage change ΔV due to the clocked standby mode.

As an example, when the clocked standby mode is disabled the clocked standby mode signal CSM_EN may be a low logic value as described above. When CSM_EN signal is a low logic value, the upper resistance 608 may be disabled and the lower resistance 610 may be enabled. Where the resistance network 310 comprises a voltage divider (depicted in FIG. 3), when R4 608 is disabled and R5 610 is enabled, the formula for $V_{REF}$ becomes:

$$V_{REF} = (V_{REG} - V_{GND}) * (R2 + R5) / (R5 + R1 + R2).$$

As the formula shows, when resistor R5 610 is enabled, $V_{REF}$ is increased. Accordingly, by choosing an appropriate value for R5 610, R1 304, and R2 306, the output reference voltage $V_{REF}$ may be increased to the desired level to be used when the clocked standby mode is disabled.

Later, when CSM_EN is raised to a high logic value and the clocked standby mode is enabled, the upper resistance 608 may be enabled and the lower resistance 610 may be disabled, thus changing the manner in which $V_{REF}$ is generated and compensating for the change ΔV in $V_{REF}$ caused by enabling the clocked standby mode. For example, where the resistance network 310 comprises a voltage divider, when R4 608 is enabled and R5 610 is disabled, the formula for $V_{REF}$ becomes $$V_{REF} = (V_{REG} - V_{GND}) * R2 / (R4 + R1 + R2).$$

As the formula shows, when R4 is enabled, $V_{REF}$ is decreased. By choosing an appropriate value for R4 608, R1 304, and R2 306, the output reference voltage $V_{REF}$ may be set at a lower level to be used when the clocked standby mode is enabled. Thus, by enabling the upper resistance 608 and disabling the lower resistance 610 when the clocked standby mode is enabled, the reference voltage $V_{REF}$ may be shifted to a lower voltage, compensating for the positive voltage shift ΔV.

FIG. 7 is a timing diagram which depicts the effect of inserting compensating, selectively enabled resistances 608, 610 into the reference voltage generator 510. As previously, at some time T1, the signal CSM_EN may be a low logic value of the indicating that the clocked standby mode is disabled. The upper resistance 608 may be disabled and the lower resistance 610 may be enabled. In one embodiment, the generated reference voltage $V_{REF}$ is determined by resistances R5 610, R1 304, and R2 306. Thus, at time T1, there may be no offset in the reference voltage $V_{REF}$ (e.g., $V_{REF} = V_{TARGET}$).

At some time later, T2, the clocked standby mode may be enabled (when CSM_EN is a high logic level), and the reference voltage generator 510 may be selectively enabled and disabled using the clocked standby mode clock CSM_CLK. When the clocked standby mode is enabled, the upper resistance 608 may be enabled and the lower resistance 610 may be disabled, exerting a compensating effect on $V_{REF}$ (e.g., lowering $V_{REF}$). Thus, as depicted at time T2 in FIG. 7, $V_{REF}$ may remain at approximately the same value ($V_{TARGET}$) as when the reference voltage generator 510 was constantly enabled when compared to FIG. 4 (i.e., when the clocked standby mode was disabled). Later, at time T3, the signal CSM_EN may be lowered to a low logic level, disabling the clocked standby mode. The upper resistance 608 may be disabled and the lower resistance 610 may be enabled, and $V_{REF}$ may remain at approximately the same level.

Due to the inherent latency in enabling and disabling the resistances, there may be some small spike of duration $t_s$ in $V_{REF}$ while the resistances 608, 610 are being enabled or disabled. However, because the spikes in $V_{REF}$ are of small magnitude and limited duration, the spikes may not have any significant effect on the functionality of the memory device 100. Also, because the magnitude of the spikes and changes in $V_{REF}$ are small, $V_{REF}$ may recover more quickly to a correct, stable value ($V_{TARGET}$), for example, at some time prior to T4.

While FIGS. 4-7 assume the offset ΔV due to clocked standby mode in $V_{REF}$ is positive, in other cases the change, ΔV, may be a negative offset in $V_{REF}$ as previously mentioned. In cases where ΔV is negative, the reference voltage generator 510 may be modified to compensate for ΔV in a manner similar to the one described above. For instance, the order in which the upper resistance 608 and lower resistance 610 are enabled and disabled may be reversed, with the upper resistance 608 being disabled and the lower resistance 610 being enabled when the clocked standby mode is enabled. By enabling the lower resistance 610 and enabling the upper resistance 608 when the clocked standby mode is enabled and ΔV is negative, the negative effect on $V_{REF}$ can be minimized by generating an upwards compensating voltage.

More generally, each of the resistances 608, 610 may be selectively enabled using any method known to those skilled in the art. For instance, in one embodiment, where ΔV is positive, a signal which is the compliment of CSM_EN may be used to selectively enable and disabled the upper and lower resistances 608, 610. The signal, which indicates when the clocked standby mode is disabled and the reference voltage is stable, may be referred to as REF_STABLE and may be a high value when the clocked standby mode is disabled. When the clocked standby mode is enabled and REF_STABLE is a low logic value, a PMOS transistor in the upper resistance 608 and an NMOS transistor in the lower resistance 610 may be used to enable and disable the upper and lower resistance 608, 610 respectively and compensate for the upward shift ΔV in $V_{REF}$. Other methods of selectively enabling and disabling resistances should be readily apparent to those skilled in the art. Similarly, embodiments of the invention may be used to advantage with other resistance networks 310 used to generate a reference voltage $V_{REF}$, including networks with active elements such as transistors and/or op-amps.

In either case, $V_{REF}$ may remain stable, regardless of whether the memory device 100 is in the clocked standby mode. When $V_{REF}$ remains stable, other circuits, such as the control circuits 102 and the temperature sensor 108 in the control circuits 102 may rely on the value of $V_{REF}$, regardless of whether the clocked standby mode is enabled.

Fluctuations in $V_{OUT}$ Due to the Clocked Standby Mode

Figure 8:
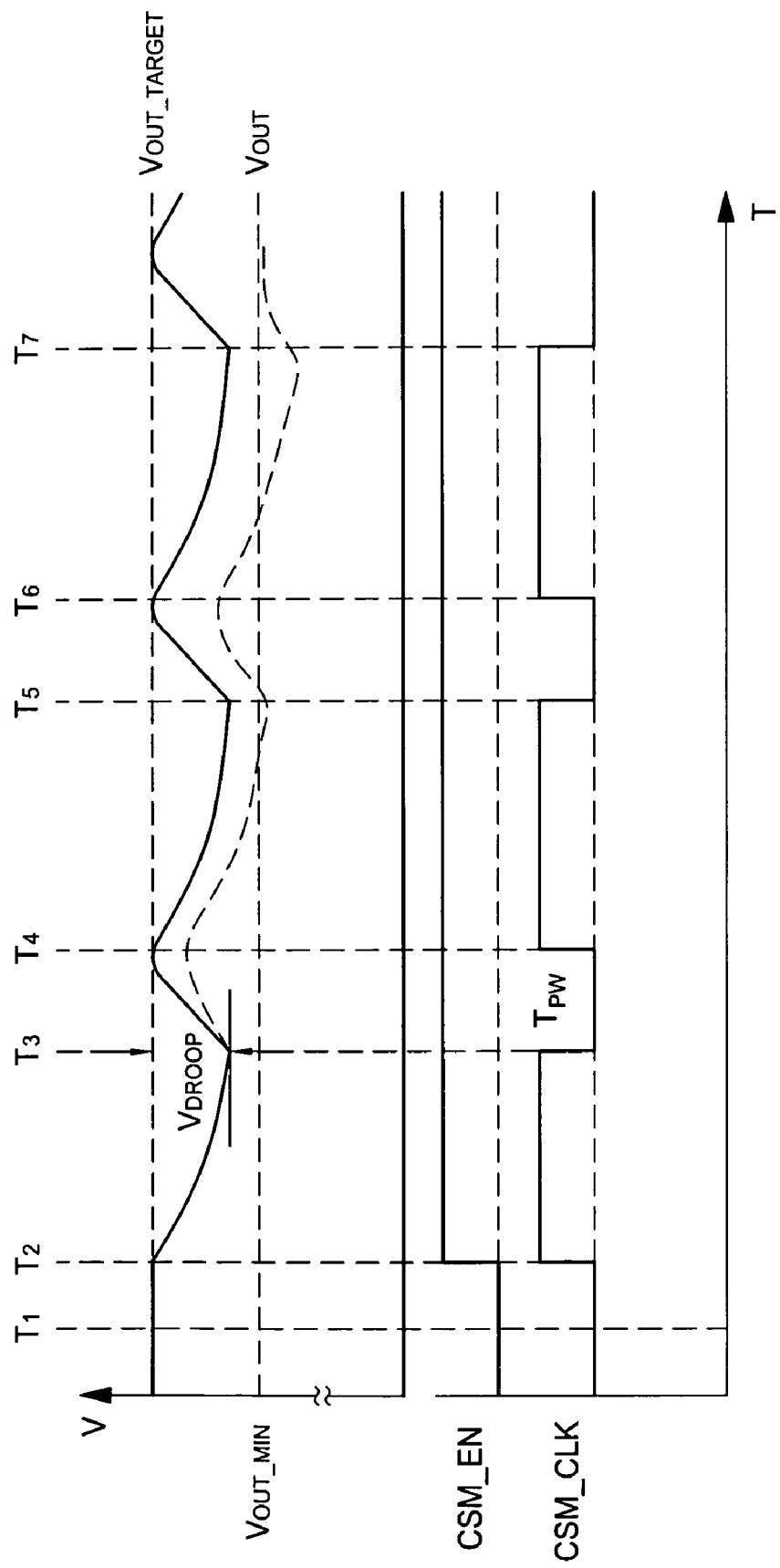
FIG. 8 is a timing diagram which depicts the effect of a clocked standby mode on the output voltage $V_{OUT}$ of a voltage generation circuit.

As mentioned previously, enabling and disabling circuits in a clocked standby mode may also cause fluctuations in the output voltage $V_{OUT}$ of a voltage generation circuit 112 due to the clocked standby mode. FIG. 8 is a timing diagram which depicts the effect of the clocked standby mode on the output voltage $V_{OUT}$ of a voltage generation circuit 112. At time T1, the CSM_EN signal may be a low logic value, indicating that the clocked standby mode is disabled. Accordingly, the signal CSM_CLK generated by the clocked standby mode controls 114 may be set at a low logic level, enabling the reference voltage generator 110 and voltage generation circuit 112 and maintaining $V_{REF}$ and $V_{OUT}$ at a constant level.

At some time later, T2, the CSM_EN signal may be raised to a high logic level, enabling the clocked standby mode. While the CSM_EN signal is raised, the clocked standby mode controls 114 may generate the CSM_CLK signal which selectively enables and disables the reference voltage generator 110 and voltage generation circuit 112. Thus, when the CSM_EN signal is raised, the clocked standby mode controls 114 may assert the CSM_CLK signal to a high logic value, causing the voltage generation circuit 112 to be disabled, thereby floating $V_{OUT}$ as described above with respect to FIG. 3.

When the memory device 100 is in the clocked standby mode, the reference voltage generator 110 and voltage generation circuit 112 may be selectively enabled just before each access to the memory device 100 occurs or when the memory device 100 otherwise uses $V_{REF}$ and/or $V_{OUT}$. Accordingly, at some time later, T3, the CSM_CLK signal may be lowered to a low logic level, causing the voltage generation circuit 112 to be enabled again and causing $V_{REF}$ and $V_{OUT}$ to be actively generated by the reference voltage generator 110 and voltage generation circuit 112 respectively so that the load on $V_{REF}$ and $V_{OUT}$ from the memory device 100 does not cause $V_{OUT}$ to fall below a critical level.

Each time the reference voltage generator 110 and voltage generation circuit 112 are enabled, the CSM_CLK signal may be lowered for a set time, referred to as the pulse width time, $T_{PW}$. After the time $T_{PW}$ has expired (at time T4), the CSM_CLK signal may again be asserted, causing the reference voltage generator 110 and voltage generation circuit 112 to be disabled again. The process of asserting and lowering CSM_CLK may be continued as long as the CSM_EN signal is asserted. Thus, the period of the CSM_CLK as well as the pulse width $T_{PW}$ of CSM_CLK determine when the reference voltage generator 110 and voltage generation circuit 112 are disabled and for how long.

While the voltage generation circuit 112 is disabled and $V_{OUT}$ is floating, $V_{OUT}$ may not remain at the exact value which is originally floated by the disabled voltage generation circuit 112. Each time the voltage generation circuit 112 is disabled, secondary effects, such as leakage currents, may slowly degenerate $V_{OUT}$. This degeneration in $V_{OUT}$ may occur even if $V_{OUT}$ is electrically isolated using switches S1 302, S2 308, S3 318, and S4 312, described above with respect to FIG. 3. This degeneration in $V_{OUT}$ is indicated in FIG. 8 as $V_{DROOP}$. The degeneration begins each time the reference voltage generator 110 and voltage generation circuit 112 are disabled and lasts until the reference voltage generator 110 and voltage generation circuit 112 are enabled by the lowering of the CSM_CLK signal, thereby driving $V_{OUT}$ upwards. In some cases, $V_{DROOP}$ may also vary with process, voltage, and temperature (PVT) variations. Each time the voltage generation circuit 112 is enabled, it may take a finite amount of time for the voltage generation circuit 112 to correct $V_{OUT}$ by driving it back to the target level. The larger the magnitude of $V_{DROOP}$ is, the longer it may take for the voltage generation circuit 112 to restore $V_{OUT}$.

Because $V_{OUT}$ is used by other circuits in the memory device 100, it may be important that $V_{OUT}$ not fall below a critical level, referred to as $V_{OUT\_MIN}$. If $V_{OUT}$ droops below $V_{OUT\_MIN}$, $V_{OUT}$ may not be restored quickly enough and other circuits on the memory device 100 which use $V_{OUT}$ may not function properly. For example, the time $T_{PW}$ for which the reference voltage generator 110 and voltage generation circuit 112 are enabled during each cycle of CSM_CLK may be insufficient to drive $V_{OUT}$ back the target level for $V_{OUT}$, referred to as $V_{OUT\_TARGET}$, which may be necessary for proper functioning of the memory device 100. Thus, for a subsequent period T5-T6, $V_{OUT}$ may fall even further from $V_{OUT\_TARGET}$, until, at time T7, the average level of $V_{OUT}$ is not maintained above the minimum voltage $V_{OUT\_MIN}$ necessary to ensure proper functioning of the memory device 100. Also, in some cases, the drop $V_{DROOP}$ may become so large that the voltage $V_{OUT}$ collapses completely. The difference between the desired level of $V_{OUT}$ and the actual level of $V_{OUT}$ due to the increasing voltage drop $V_{DROOP}$ is depicted in the timing diagram of FIG. 8 by the difference between the dashed line (representing $V_{OUT}$) and the solid line (representing a desired level of $V_{OUT}$ maintained close to $V_{OUT\_TARGET}$).

In one embodiment of the invention, the reference voltage $V_{REF}$ used to generate $V_{OUT}$ may be modified to compensate for the increasing drop $V_{DROOP}$ in $V_{OUT}$ caused by the clocked standby mode. For example, $V_{REF}$ may be modified such that $V_{REF}$ is increased when the clocked standby mode is enabled (e.g., when CSM_EN is a high logic level). When the clocked standby mode is enabled and $V_{REF}$ is increased, the voltage generator 112 (shown in FIG. 1) which uses $V_{REF}$ to generate $V_{OUT}$ may try to drive $V_{OUT}$ to a higher level corresponding to the increased value of $V_{REF}$. When the voltage generator 112 attempts to drive $V_{OUT}$ to a higher level, the rate at which $V_{OUT}$ increases is correspondingly greater, allowing quicker recovery of $V_{OUT}$. Thus, when $V_{REF}$ is increased, $V_{OUT}$ may be maintained at a higher voltage level such that $V_{OUT}$ recovers fully from the voltage drop $V_{DROOP}$ during each period $T_{PW}$ during which the reference voltage generator 110 and voltage generation circuit 112 are enabled.

Figure 9:
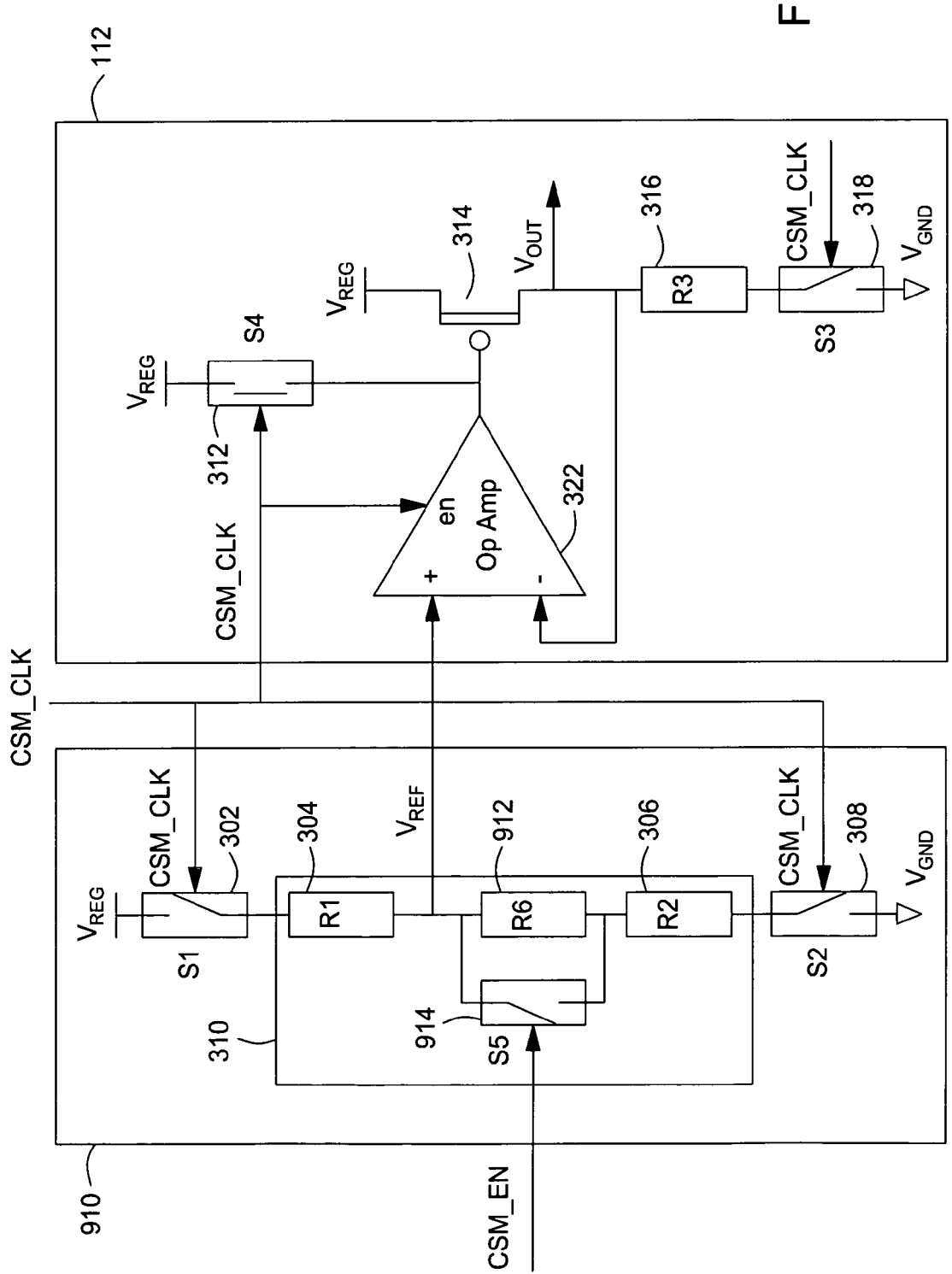
FIG. 9 depicts a modified reference voltage generator circuit which may be used to generate a reference voltage $V_{REF}$ that is increased during the clocked standby mode according to one embodiment of the invention.

FIG. 9 depicts a modified reference voltage generator circuit 910 which may be used to generate a reference voltage $V_{REF}$ that is increased during the clocked standby mode according to one embodiment of the invention. The reference voltage generator 910 depicted in FIG. 9 is a modified version of the reference voltage generator circuit 110 depicted in FIG. 3. The reference voltage generator circuit 110 of FIG. 3 has been modified by inserting a resistor R6 912 between resistor R2 306 and the reference voltage output line for the $V_{REF}$ signal. The resistor R6 912 may be selectively enabled and disabled (shunted) using switch S5 914.

According to one embodiment of the invention, switch S5 may be controlled by the signal for enabling and disabling the clocked standby mode, CSM_EN. When the clocked standby mode of the memory device 100 is disabled, CSM_EN may be a low logic level and switch S5 914 may be closed. When switch S5 914 is closed, current in the voltage divider may flow through the switch 914 instead of resistor R6 912, shorting and thus disabling resistor R6 912. When resistor R6 912 is disabled, the reference voltage generator 910 may generate the reference voltage $V_{REF}$ using only resistors R1 304 and R2 306 as described by the same equation given above with respect to FIG. 3:

$$V_{REF} = (V_{REG} - V_{GND}) * R2/(R1+R2).$$

Accordingly, when the clocked standby mode is disabled, the reference voltage $V_{REF}$ may be a normal (or default) value according to the values chosen for resistors R1 304 and R2 306.

When the clocked standby mode is enabled and CSM_EN is raised to a high logic level, switch S5 may be opened, causing current to flow through resistor R6 912 instead of switch S5 and thus enabling resistor R6. When resistor R6 912 is enabled, the reference voltage generator 910 may generate the reference voltage $V_{REF}$ using resistors R1 304, R2 306, and R6 912. When the voltage divider generates $V_{REF}$ using R1 304, R2 306, and R6 912, $V_{REF}$ is described by the equation:

$$V_{REF} = (V_{REG} - V_{GND}) * (R2+R6)/(R1+R2+R6).$$

By choosing an appropriate value for R6 912, $V_{REF}$ may be increased a desired amount when the clocked standby mode is enabled.

Figure 10:
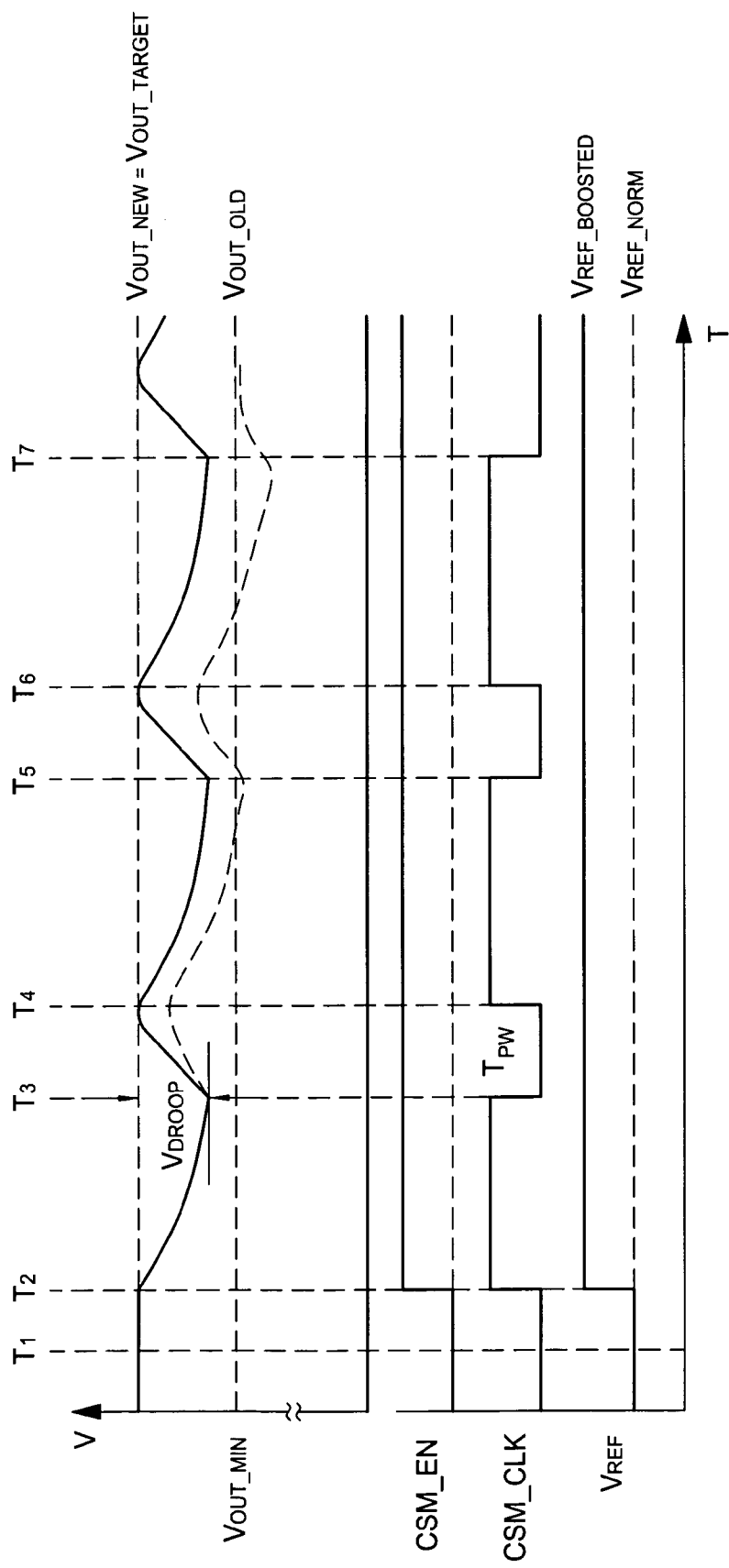
FIG. 10 is a timing diagram showing the effect of an increased reference voltage $V_{REF}$ on the output voltage $V_{OUT}$ when a clocked standby mode is enabled according to one embodiment of the invention.

FIG. 10 is a timing diagram showing the effect of an increased reference voltage $V_{REF}$ on the output voltage $V_{OUT}$ when a clocked standby mode is enabled according to one embodiment of the invention. At time T1, the CSM_EN signal may be a low logic value, indicating that the clocked standby mode is disabled. Accordingly, the signal CSM_CLK generated by the clocked standby mode controls 114 may be set at a low logic level, enabling the reference voltage generator 910 and voltage generation circuit 112 and maintaining $V_{REF}$ and $V_{OUT}$ at a constant level. Because switch S5 914 may be closed, resistor R6 912 may have no effect on the voltage divider used to generate $V_{REF}$. Accordingly, $V_{REF}$ may be maintained at a normal operating value.

At some time later, T2, the CSM_EN signal may be raised to a high logic level, enabling the clocked standby mode. While the CSM_EN signal is raised and the clocked standby mode is enabled, the clocked standby mode controls 114 may generate the clocked standby mode clock signal CSM_CLK. CSM_CLK may selectively enable and disable the reference voltage generator 910 and voltage generation circuit 112. Switch S5 914 which is controlled by CSM_EN may be opened when CSM_EN is a high logic value, causing current in the voltage divider to flow through resistor R6 912 instead of switch S5 914. Thus, the voltage divider in the reference voltage generator 910 may use resistor R6 912 to generate an increased value for the reference voltage $V_{REF}$, labeled $V_{REF\_BOOSTED}$ (when the reference voltage generator 910 is enabled).

At time T3-T4, the CSM_CLK signal is lowered. When the CSM_CLK signal is lowered, the reference voltage generator 910 and voltage generation circuit 112 may be enabled. Because $V_{REF}$ is increased when the clocked standby mode is enabled (e.g., CSM_EN is a high logic value and switch S5 914 is open), the modified output voltage $V_{OUT\_NEW}$ (represented by the dark line) may be driven fully to the target voltage $V_{OUT\_TARGET}$ and thus maintained at a higher voltage than the unmodified voltage $V_{OUT\_OLD}$ (represented by the dashed line). Thus, during each period (T3-T4, T5-T6, and beginning at T7) for which the voltage generators 910, 112 are disabled, $V_{OUT\_NEW}$ may remain above the minimum threshold $V_{OUT\_MIN}$ necessary for proper functioning of the memory device 100. In other words, while the floated output voltage $V_{OUT}$ may continue to drop some small amount due to leakage currents, the boosted value of $V_{REF}$ used to generate $V_{OUT}$ may be chosen such that $V_{OUT}$ recovers fully from the voltage drop $V_{DROOP}$ each time the reference voltage generator 110 and voltage generation circuit 112 are enabled during period $T_{PW}$. Thus, $V_{OUT\_NEW}$ may be maintained near $V_{OUT\_TARGET}$ and prevented from falling below the critical level $V_{OUT\_MIN}$. Thus, circuits utilizing $V_{OUT}$ may function properly.

While embodiments are described herein with respect to one or more voltages affected by a clocked standby mode, it is also contemplated that embodiments of the invention may be used to effect in any situation where a reference voltage or the output voltage of a reference voltage generator is affected by any operating characteristics of an integrated circuit.

Furthermore, while the foregoing is directed to embodiments of the present invention, other and further embodiments of the invention may be devised without departing from the basic scope thereof, and the scope thereof is determined by the claims that follow.

What is claimed is:

1. A method for controlling an output reference voltage generated by a reference voltage generator disposed on a device, comprising:
   receiving a signal for enabling a clocked standby mode of the device;
   if the signal indicates that the device is in the clocked standby mode, generating a first reference voltage as the output reference voltage of the reference voltage generator; and
   if the signal indicates that the device is not in the clocked standby mode, generating a second reference voltage as the output reference voltage of the reference voltage generator, wherein the first reference voltage is larger than the second reference voltage; and wherein:
      a voltage generation circuit maintains an output voltage using the generated output reference voltage, the voltage generation circuit being selectively enabled or disabled by a clocked standby mode signal when the device is in the clocked standby mode, and
      the first reference voltage compensates for a voltage drop in the output voltage generated by the voltage generation circuit resulting from selectively enabling and disabling the voltage generation circuit.

2. The method of claim 1, wherein a clocked standby mode clock signal selectively enables and disables the reference voltage generator when the device is in the clocked standby mode.

3. The method of claim 1, wherein the first reference voltage is larger than the second reference voltage.

4. The method of claim 1, wherein the device is a memory device.

5. A device for controlling an output reference voltage generated by a reference voltage generator disposed on the device, comprising:
   circuitry configured to:
      receive a signal for enabling a clocked standby mode of the device;
      if the signal indicates that the device is in the clocked standby mode, generate a first reference voltage as the output reference voltage of the reference voltage generator; and
      if the signal indicates that the device is not in the clocked standby mode, generate a second reference voltage as the output reference voltage of the reference voltage generator, wherein the first reference voltage is larger than the second reference voltage; and wherein:
         a voltage generation circuit maintains an output voltage using the generated output reference voltage, the voltage generation circuit being selectively enabled or disabled by a clocked standby mode signal when the device is in the clocked standby mode, and
         the first reference voltage compensates for a voltage drop in the output voltage generated by the voltage generation circuit resulting from selectively enabling and disabling the voltage generation circuit.

6. The device of claim 5, wherein a clocked standby mode clock signal selectively enables and disables the reference voltage generator when the device is in the clocked standby mode.

7. The device of claim 5, wherein the first reference voltage is larger than the second reference voltage.

8. The device of claim 5, wherein the first reference voltage is different from the second reference voltage.

9. The method of claim 1, wherein the first reference voltage is different from the second reference voltage.

* * * * *